(12) United States Patent
Ghanekar et al.

(10) Patent No.: US 7,778,828 B2
(45) Date of Patent: Aug. 17, 2010

(54) METHOD AND SYSTEM FOR AUTOMATIC GAIN CONTROL OF A SPEECH SIGNAL

(75) Inventors: Sachin Ghanekar, Pune (IN); Anoop Deoras, Nagpur (IN)

(73) Assignee: Sasken Communication Technologies Ltd., Bangalore (IN)

( * ) Notice: Subject to any disclaimer, the term of this patent is extended or adjusted under 35 U.S.C. 154(b) by 1048 days.

(21) Appl. No.: 11/499,483

(22) Filed: Aug. 4, 2006

(65) Prior Publication Data

US 2007/0217627 A1 Sep. 20, 2007

(30) Foreign Application Priority Data

Mar. 15, 2006 (IN) .................................. 468/06

(51) Int. Cl.
*G10L 21/02* (2006.01)
(52) U.S. Cl. .................. 704/225; 704/226; 381/94.2
(58) Field of Classification Search ................ 704/225, 704/226; 381/94.2
See application file for complete search history.

(56) References Cited

U.S. PATENT DOCUMENTS

| | | | |
|---|---|---|---|
| 5,146,504 A | | 9/1992 | Pinckley |
| 5,267,322 A | * | 11/1993 | Smith et al. .................. 381/107 |
| 5,778,338 A | * | 7/1998 | Jacobs et al. ................. 704/223 |
| 5,937,377 A | * | 8/1999 | Hardiman et al. ........... 704/225 |
| 6,314,396 B1 | | 11/2001 | Monkowski |
| 6,604,071 B1 | | 8/2003 | Cox et al. |
| 2004/0242172 A1 | * | 12/2004 | Haim et al. ............... 455/127.2 |

* cited by examiner

*Primary Examiner*—Daniel D Abebe
(74) *Attorney, Agent, or Firm*—William L. Botjer

(57) ABSTRACT

A method and system for automatic gain control of a speech signal in a communication system are disclosed. The gain of the speech signal can be controlled, based on a calculated gain value. This gain value is calculated on the basis of energy calculation and speech activity identification in the speech signal which is done by means of the encoder. Encoding the gain controlled speech signal for transmission follows the step of gain control.

13 Claims, 15 Drawing Sheets

| Functionality of the Block | Average MIPS when AGC is not used in conjunction with the encoder | Average MIPS when AGC is used in conjunction with the encoder |
|---|---|---|
| High Pass Filtering (HPF) | 0.225 | - |
| Silence Indication (SID) Computation | 1.1528 | - |
| Signal Energy Computation (E) | 0.8367 | - |
| Peak Detection Logic and Gain Correction (AGC) | 0.1 | 0.1 |
| Total MIPS | 2.3145 | 0.1 |

FIG. 12

METHOD AND SYSTEM FOR AUTOMATIC GAIN CONTROL OF A SPEECH SIGNAL

CLAIM OF PRIORITY

This Application Claims Priority of Indian Patent Application No. 468/CHE/2006 Filed Mar. 15, 2006

BACKGROUND

The present invention relates generally to processing speech signals in a communication system. More specifically, the present invention relates to automatic gain control (AGC) of speech signals in the communication system.

In communication systems, a speech signal from a transmitting microphone is highly sensitive to the relative position of a user with respect to the microphone. The AGC circuit maintains the speech signal at a desired audible level by correcting the gain of the speech signal. The gain corrected speech signal is then converted into the digital format by an Analog-to-Digital converter. This digital speech signal is then encoded based on the bandwidth allocation of the transmission medium. The Analog-to-Digital converter can be either an integrated part of the encoder or a separate unit before the encoder.

A conventional method is disclosed in the U.S. Pat. No. 6,604,071 titled 'Speech Enhancement With Gain Limitations Based On Speech Activity'. According to the method, a speech signal is divided into data frames that represent background noise as well as articulated speech activity. Gain for data frames is determined individually, both in case of background noise as well as speech activity. A limitation is applied to the determined gain of the data frames by making the gain equal to the Signal-to-Noise Ratio (SNR) and the data frames are integrated back to obtain a gain controlled speech signal. The AGC circuit uses a first order recursive filter to determine the SNR. The gain controlled speech signal is then provided at the encoder's input stage.

Another conventional method is disclosed in the U.S. Pat. No. 6,314,396 titled 'Automatic Gain Control In A Speech Recognition System'. The method aims at differentiating a speech activity with static noise present in a speech signal. According to the method, the speech signal is divided into data frames with each data frame of a fixed time interval. An energy tracker calculates the levels of energy as high energy, low energy, and the mid energy track of the speech signal, based on high-biased running mean, low-biased running mean, and a nominally-unbiased running mean. The value of normalized energy is calculated from the high energy tracks and provided to a speech recognition system. The output of the speech recognition system is fed back to achieve optimum speech recognition.

Yet another conventional method is disclosed in the U.S. Pat. No. 5,146,504 titled 'Speech Selective Automatic Gain Control'. This method aims to achieve AGC by converting an analog speech signal to a digital speech signal. The digital speech signal is further converted from a linear form to a logarithmic form and peak energy of the logarithmic digital speech signal is detected. The invention implements a speech recognizer to detect the speech signal. Variations in the peak energy of the speech signal are removed by a smoothing circuit. The smooth speech signal is subtracted from a reference signal and an error signal is obtained in the form of a logarithmic gain signal. The logarithmic gain signal is converted back into a linear gain signal and the linear gain signal is multiplied to the speech signal. As a consequence, AGC is used only in those cases where a speech activity is present in the speech signal. The method aims at controlling the gain of the speech signal prior to encoding.

In view of the above discussion, these conventional methods provide AGC by identifying speech activities in a speech signal and computing the energy of the speech signal. Further, the peak energy in the speech signal is detected. The detected peak energy is incremented or decremented depending on the desired audible output of speech signal.

The AGC methods discussed above use the AGC circuit as an independent module for gain correction. The gain corrected speech signal is then fed to an encoder circuit for encoding. The encoder circuit detects the energy and the speech activity in the gain corrected speech signal and thereafter converts the gain corrected speech signal from analog to digital format before encoding. This increases the time and the required rate of average Million Instructions Per Second (MIPS) for controlling the gain and encoding the gain corrected speech signal.

Therefore, there exists a need for an AGC system that aims at reducing the time, and consequently the MIPS rate, required for controlling the gain of the speech signal and encoding the gain corrected speech signal.

SUMMARY

An object of the invention is to provide an AGC system for processing speech signals in a communication system.

Another object of the invention is controlling the gain of speech signals in the communication system.

Yet another object of the invention is to provide an AGC system that reduces the time required for an independent calculation of energy of speech signals and detection of speech activity in the speech signals.

Still another object of the invention is to provide an AGC system that reduces the Million instructions Per Second (MIPS) rate while correcting the gain of the speech signal and encoding the gain corrected speech signal.

The invention comprises a system and a method for achieving the above mentioned objectives. The system comprises a gain block, a feedback gain block, and an encoder. The method comprises the steps of receiving a speech signal at the gain block and applying gain correction on the received speech signal by the gain block. The gain correction is applied on the basis of a correction value that is received as a feedback from the feedback gain block. The feedback gain block, in turn, receives energy values of speech signal from the encoder that performs energy computations and speech activity estimation of the speech signal. The encoder also encodes the gain corrected speech signal for transmission. As the functions of energy calculation and speech activity estimation are performed by the encoder in the present invention as compared to a separate unit as shown in the prior art, the consumed time and the MIPS rate can be reduced substantially.

BRIEF DESCRIPTION OF THE DRAWINGS

The preferred embodiments of the present invention will hereinafter be described in conjunction with the appended drawings provided to illustrate and not to limit the invention, wherein like designations denote like elements, and in which:

FIG. 12 is a tabular representation showing a comparison of MIPS values between the AGC system used in prior art and the AGC system used in the present invention.

DESCRIPTION OF PREFERRED EMBODIMENTS

Embodiments of the present invention relate generally to speech signals in a communication system. More specifically, embodiments of the present invention relate to gain correction of a speech signal that serves as the input to the communication system. The speech signal may be divided into one or more speech segments. The gain correction may be performed on the one or more speech segments. The communication system can either be a hands-free communication system or a handheld communication system. A typical communication system comprises an encoder, a transmitter, a channel, a receiver, and a decoder. The gain correction of speech segments can be applied before the speech segments are being encoded for transmission.

Figure 1:
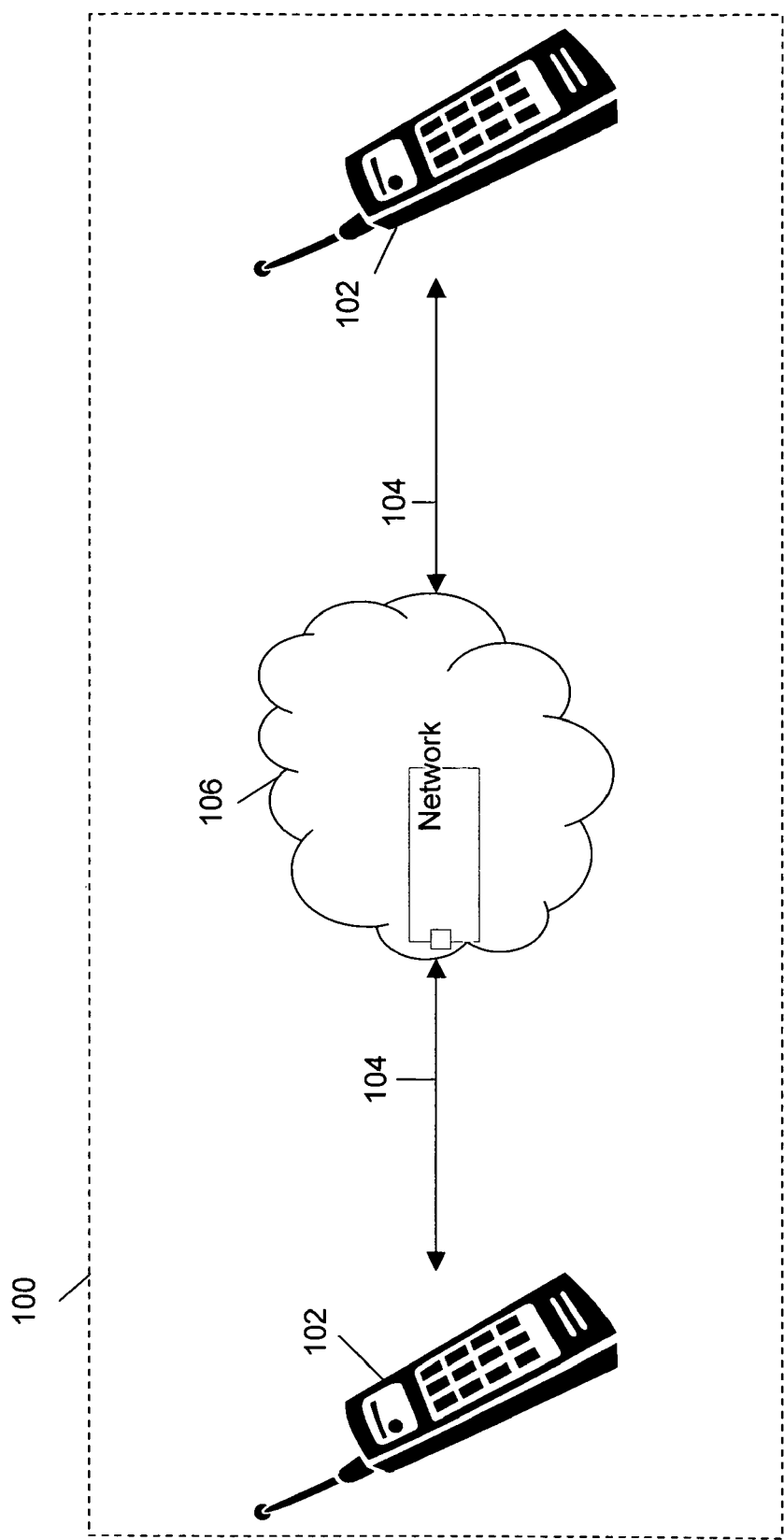
FIG. 1 is a block diagram of a communication system including one or more communication devices, in accordance with an exemplary embodiment of the present invention.

FIG. 1 is a block diagram of communication system 100 including one or more communication devices 102, in accordance with the exemplary embodiment of the present invention. Communication devices 102 can be connected to each other through communication channels 104 over a network 106. Communication devices 102 can be selected from a group of wired or wireless telephone devices, which can, for example, operate on 2G, 2.5G, 3G, TDMA, CDMA, GSM and any other suitable technologies. Communication channel 104 can be a wireless channel, a wired channel or a combination thereof.

Figure 2:
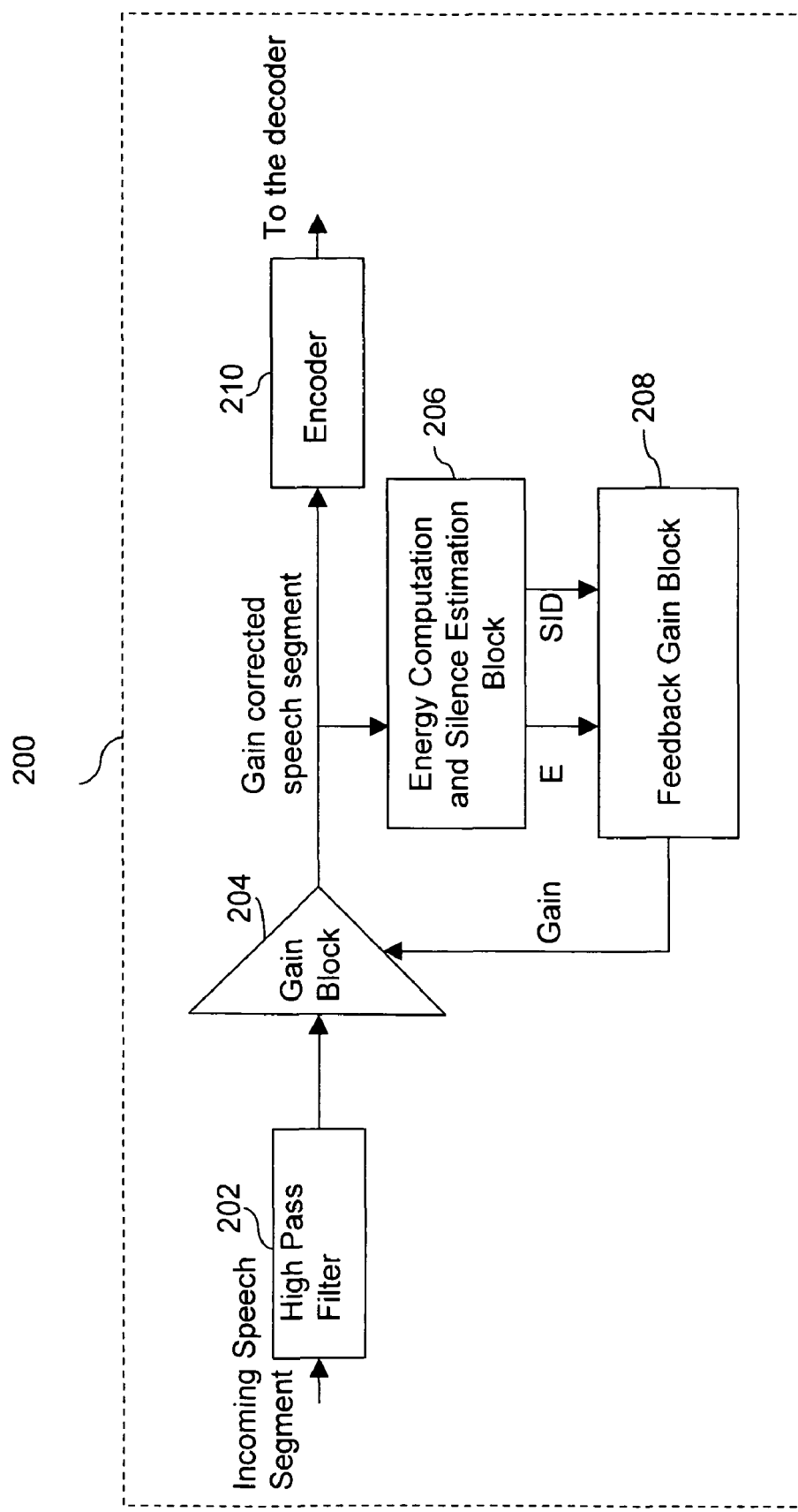
FIG. 2 is a block diagram of a prior art AGC system in a communication device.

FIG. 2 is a block diagram of a prior art for AGC system 200 in communication device 102. AGC system 200 includes a high pass filter 202, a gain block 204, an energy computation and silence estimation block 206, a feedback gain block 208, and an encoder 210. High pass filter 202, gain block 204, energy computation and silence estimation block 206, and feedback gain block 208 together form a gain correction block. An incoming speech segment is provided to high pass filter 202. High pass filter 202 filters out low frequency components and the direct current offset from the incoming speech segment. Gain block 204 applies a gain correction to the filtered speech segment. The gain corrected speech segment from gain block 204 can be expressed by the following formula:

$$S_g = \text{gain} * S_{ftr} \quad (1)$$

where:

'$S_{ftr}$' is the filtered speech segment, and
'$S_g$' is the gain corrected speech segment.

Energy computation and silence estimation block 206 computes the energy of the gain corrected speech segment and indicates the speech activity in the gain corrected speech segment. The energy of the gain corrected speech segment can be expressed by the following formula:

$$E = \sum_{n=1}^{160} S_g * S_g \quad (2)$$

where:

'E' is the energy of the gain corrected speech segment, and
'n' is the number of speech samples into which each gain corrected speech segment is divided.

The speech activity is indicated by a silence indication (SID) value. The SID value can be 0 if speech activity is indicated in the gain corrected speech segment, whereas the SID value can be 1 if speech inactivity (silence) is indicated in the gain corrected speech segment.

The energy, E, and the silence indication value, SID, are provided to feedback gain block 208 for computing the gain value. Feedback gain block 208 detects the peak active energy of the gain corrected speech segment and computes the gain value for correction. Feedback gain block 208 provides the gain value to gain block 204 as a feedback.

Encoder 210 encodes the gain corrected speech segment for transmission. The gain corrected speech signal is converted into the digital format in an Analog-to-Digital converter before it is encoded by encoder 210. Encoder 210 encodes the digital speech signal based on the bandwidth allocation of the transmission medium. Encoder 210 again computes the energy, E, and the silence indication value, SID, for encoding the gain corrected speech segment. Thus, according to the prior art, the instructions required for energy computation and speech activity detection are repeated as encoder 210 again performs the same computations. Therefore, the MIPS for gain correction is substantially higher in the prior art.

Figure 3:
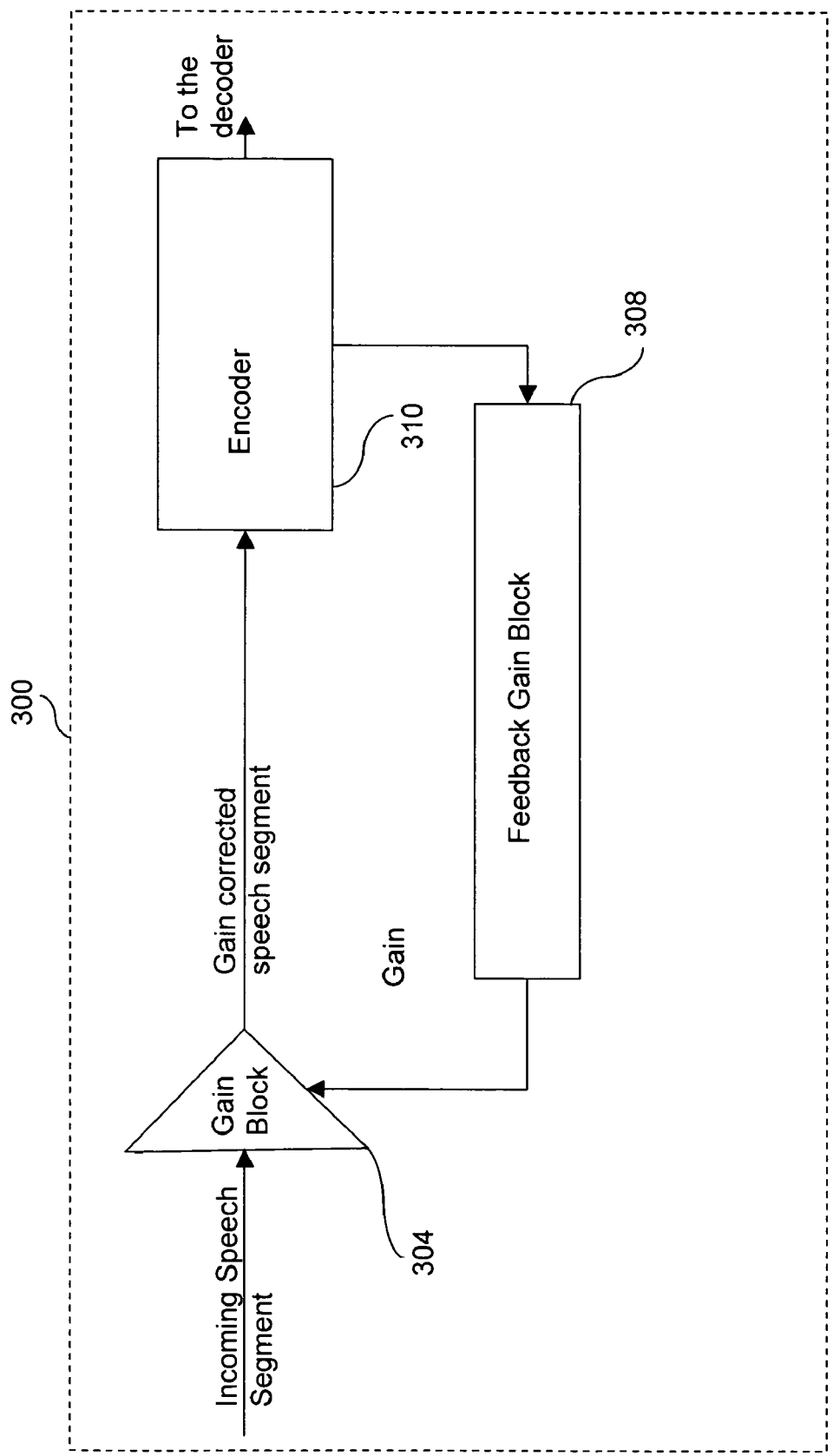
FIG. 3 is a block diagram of an AGC system in a communication device, in accordance with an exemplary embodiment of the present invention.

FIG. 3 is a block diagram of AGC system 300 in communication device 102, in accordance with an exemplary embodiment of the present invention. AGC system 300 includes a gain block 304, a feedback gain block 308, and an encoder 310. Gain block 304 receives an incoming speech segment and applies gain correction on the incoming speech segment. Feedback gain block 308 detects the peak active energy of the gain corrected speech segment and calculates a gain value. The calculated gain value is provided to gain block 304 as a feedback. Encoder 310 encodes the gain corrected speech segment for transmission. Encoder 310 also computes the energy (E) and the SID value of the gain corrected speech segment. Encoder 310 may be any suitable codec block such as a Code Excited Linear Prediction (CELP) coder. The CLEP coder may be an adaptive multi rate speech (AMR) coder. The energy, E, and the SID value of the gain corrected speech segment may be computed using the auto-correlation prediction approach. The value of E and SID computed by encoder 310 are provided to feedback gain block 308 for peak active energy detection and gain value calculation.

Figure 4:
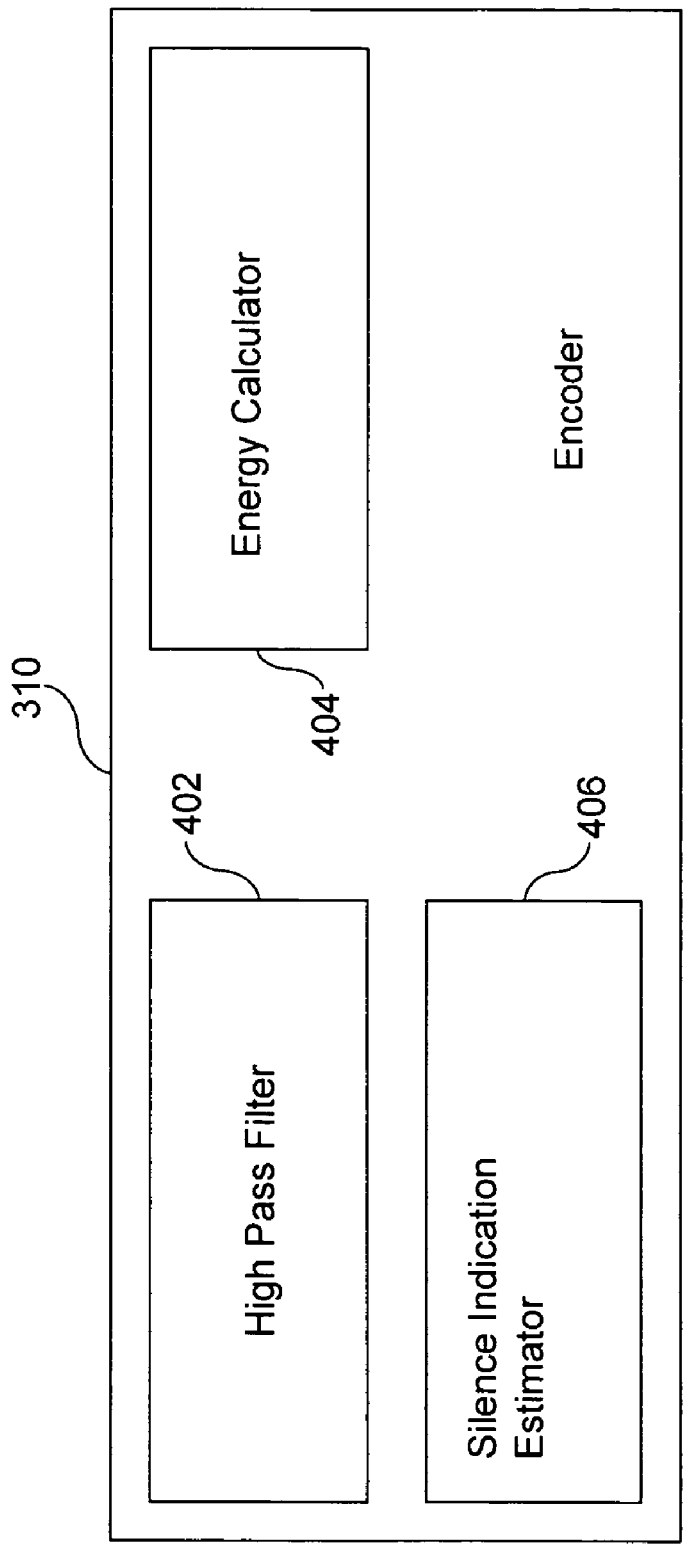
FIG. 4 is a block diagram of an encoder, in accordance with an exemplary embodiment of the present invention.

FIG. 4 is a block diagram of encoder 310, in accordance with an exemplary embodiment of the present invention. Encoder 310 includes a high pass filter 402, an energy calculator 404 and a silence indication estimator 406. High pass filter 402 removes the unwanted low frequency components and the direct current offset from the gain corrected speech segment. Energy calculator 404 computes the energy of the gain corrected speech segment. Silence indication estimator 406 determines speech activity or inactivity in the gain corrected speech segment. The output of silence indication estimator 406 is a SID value.

Figure 5:
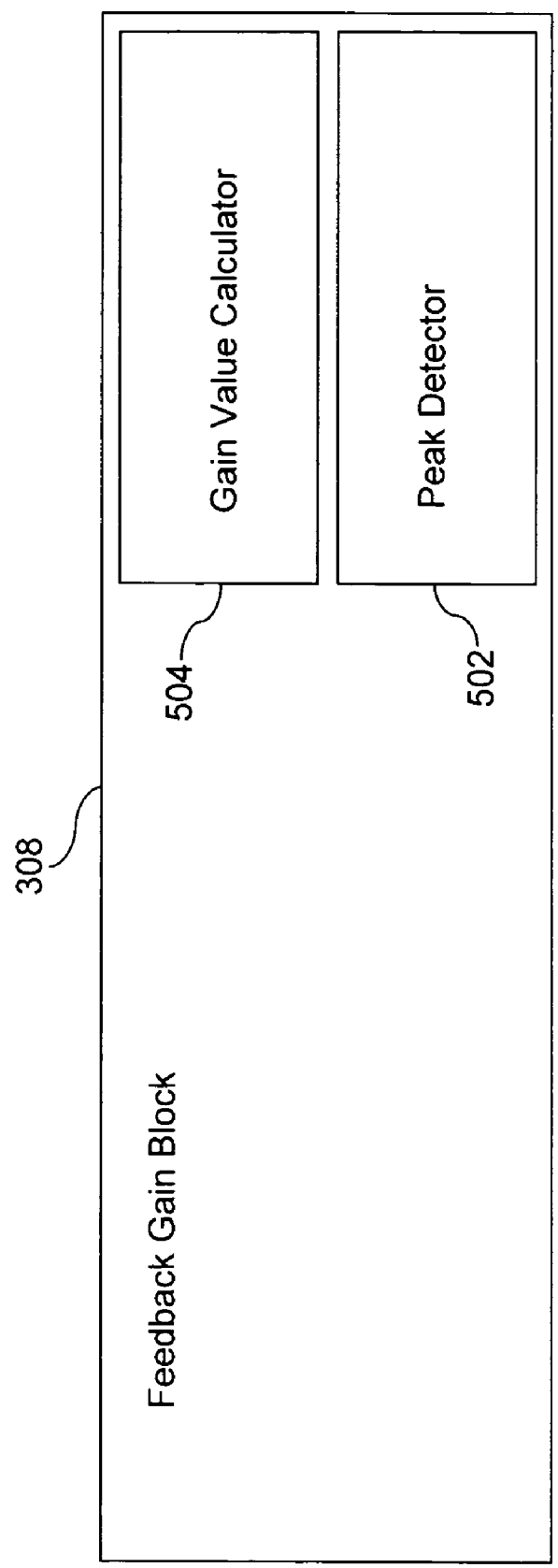
FIG. 5 is a block diagram of a feedback gain block, in accordance with an exemplary embodiment of the present invention.

FIG. 5 is a block diagram of feedback gain block 308, in accordance with an exemplary embodiment of the present invention. Feedback gain block 308 includes a peak detector 502 and a gain value calculator 504. Peak detector 502 detects the peak active energy of the gain corrected speech segment. The peak active energy is detected on comparing the gain corrected speech segment energy with a pre-defined energy value. Gain value calculator 504 calculates the gain value depending on the detected peak active energy. The calculated gain value is provided to gain block 304 as a feedback.

Figure 6:
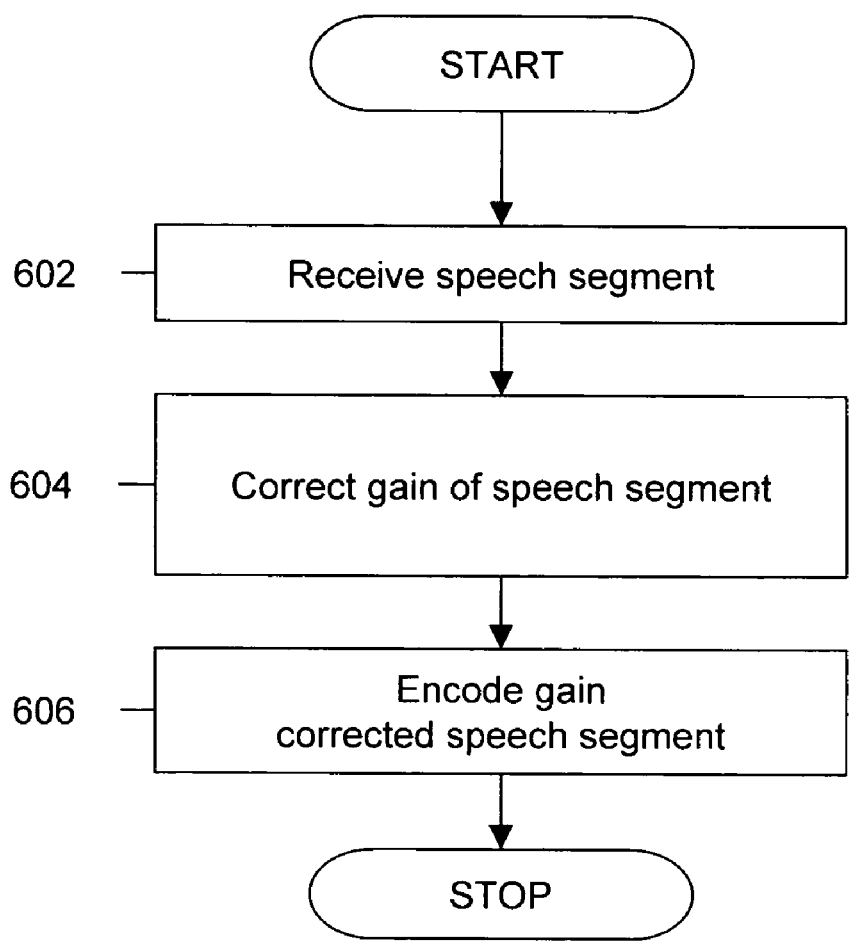
FIG. 6 is a flowchart illustrating a method for gain control of a current incoming speech segment in an AGC system, in accordance with an exemplary embodiment of the present invention.

FIG. 6 is a flowchart, illustrating a method for gain control of a speech segment in AGC system 300, in accordance with an embodiment of the present invention. At step 602, a current incoming speech segment is received by gain block 304. At step 604, the gain of the current incoming speech segment is corrected by a gain value. The gain value is based on the computed energy and SID values of the previous speech segment. The energy and the SID values are computed by encoder 310 and are provided to feedback gain block 308. Then, at step 606, encoder 310 encodes the gain corrected speech segment for transmission.

Figure 7:
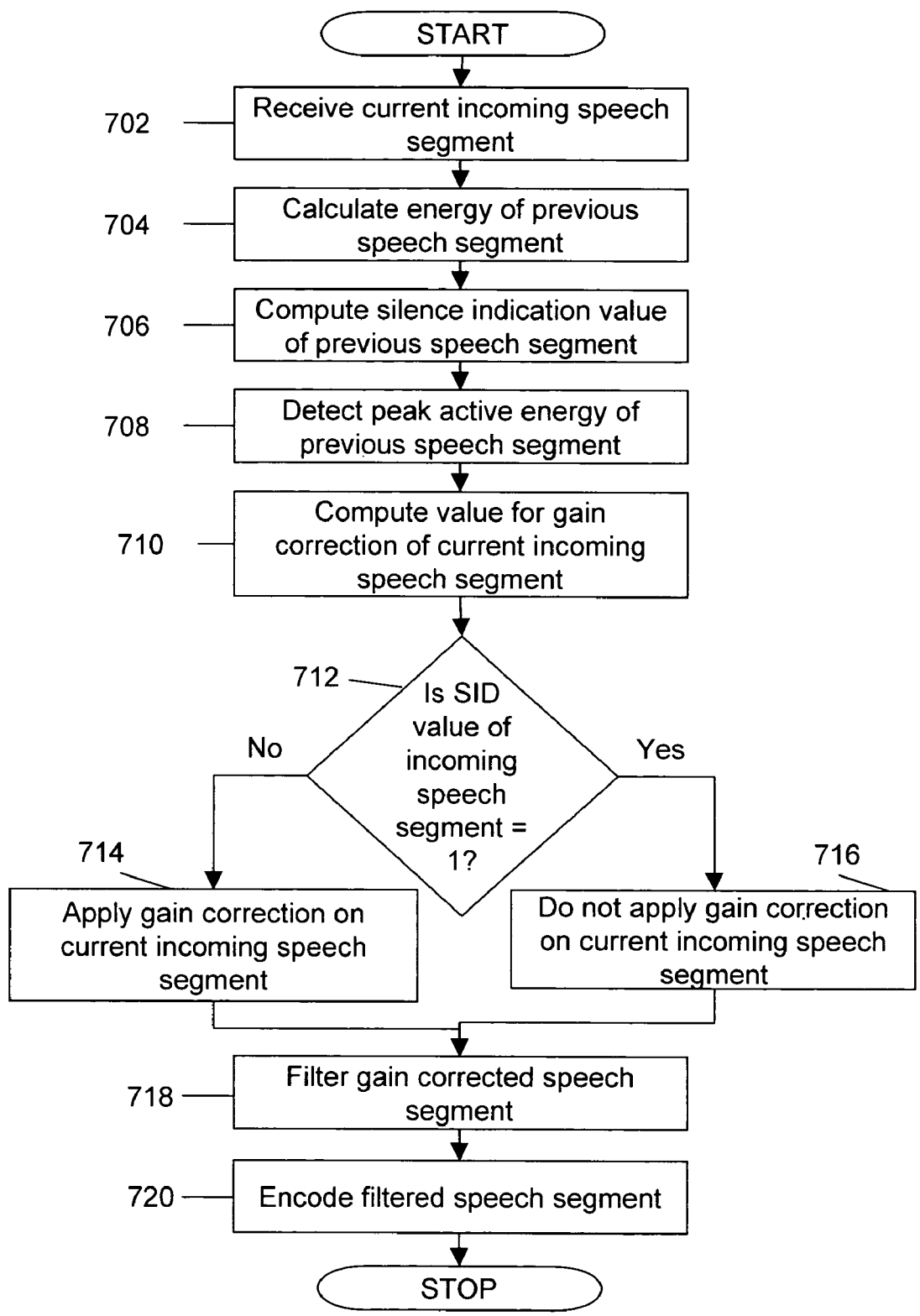
FIG. 7 is a flowchart illustrating a detailed method for gain control of a current incoming speech segment in an AGC system, in accordance with an exemplary embodiment of the present invention.

FIG. 7 is a flowchart, illustrating a detailed method for gain control of a speech segment in AGC system 300, in accordance with an embodiment of the present invention. At step 702, a current incoming speech segment is received by gain block 304. At step 704, energy calculator 404 calculates the energy of the previous speech segment. Energy calculator 404 may divide the previous speech segment into samples of fixed intervals for calculating the energy of the previous speech segment. Next, at step 706, silence indication estimator 406 computes a SID value for the previous speech segment. Silence indication estimator 406 can classify the previous speech segment as a segment that has speech activity or speech inactivity (silence) depending on the energy of the previous speech segment. SID value from silence indication estimator 406 can be a binary value. The binary SID value can be 0 if silence indication estimator 406 classifies speech activity in the previous speech segment whereas the binary SID value can be 1 if silence indication estimator 406 classifies speech inactivity in the previous speech segment. The binary SID value of the previous speech segment is forwarded to feedback gain block 308.

At step 708, the peak active energy of the previous speech segment is detected by peak detector 502 in feedback gain block 308. The peak active energy is detected on the basis of comparison of actual peak energy of the previous speech segment with an average level of energy at which communication system 100 should be operated. An algorithm for the peak active energy detection is explained in detail in conjunction with FIG. 8. At step 710, the detected peak active energy is then used by gain value calculator 504 to calculate the gain value with which a correction is applied to the current incoming speech segment. Gain value calculator 504 attempts to keep the sum of detected peak active energy of the previous speech segment and the gain value within a pre-defined minimum energy level and a pre-defined maximum energy level. A correction to the gain value is applied to bring the detected peak active energy between the pre-defined minimum energy level and the pre-defined maximum energy level. The gain value obtained during this process is the calculated gain value. An algorithm for gain value calculation is explained in detail in conjunction with FIG. 9. The calculated gain value is provided to gain block 304 as a feedback.

At step 712, it is checked whether the SID value of the current incoming speech segment is equal to 1. If the SID value of the speech segment is not equal to 1, step 714 is performed. At step 714, a correction of the gain value is applied to the current incoming speech segment by gain block 304. At step 712, if the SID value of speech segment is equal to 1, step 716 is performed. At step 716, a correction of the gain value is not applied to the current incoming speech segment.

Then, at step 718, the gain corrected speech segment is filtered to remove low frequency components and the direct current offset components present in it. The gain corrected speech segment is filtered by encoder 310. At step 720, the filtered speech segment is encoded by encoder 310 for transmission.

Figure 8A:
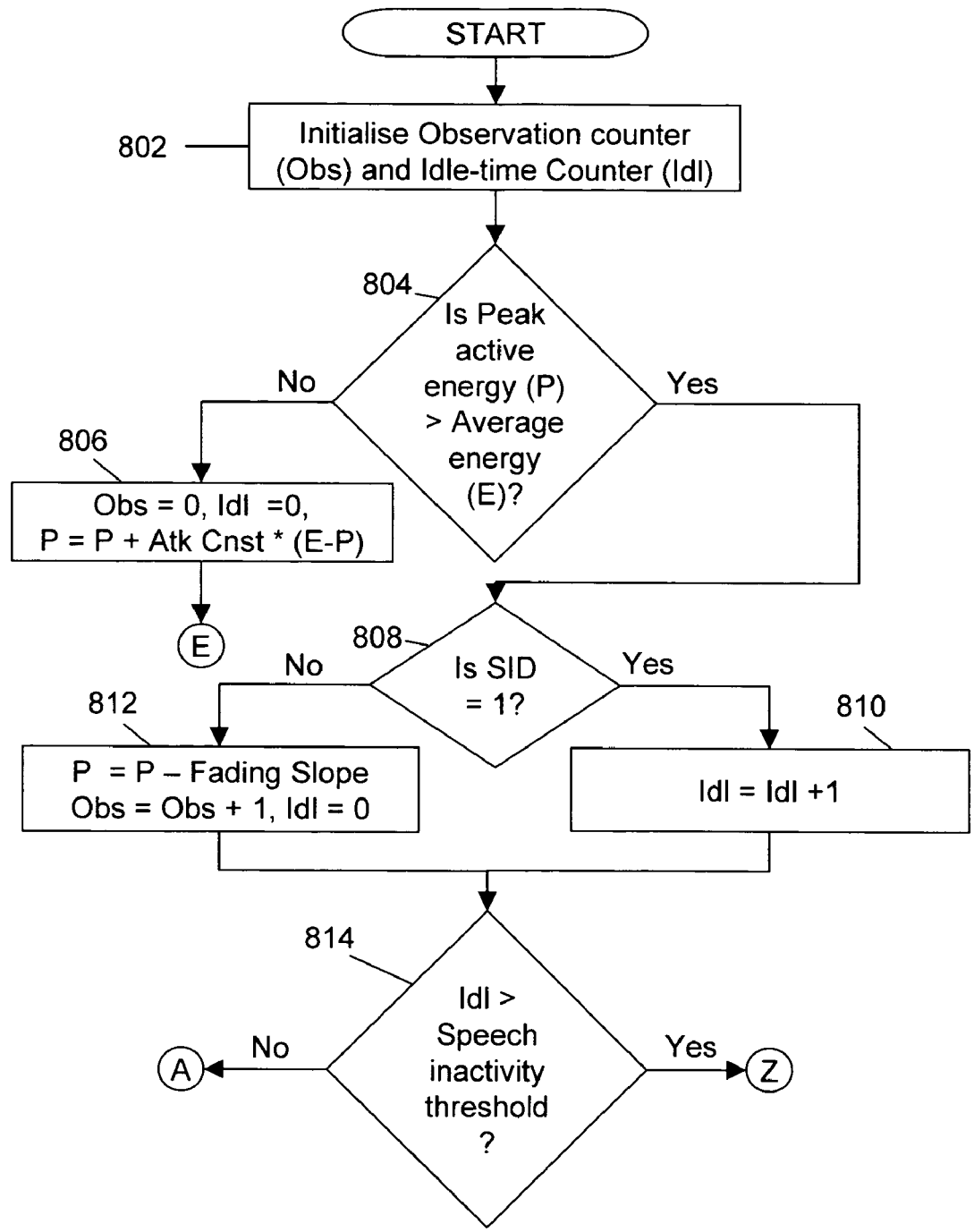
FIG. 8 is a flowchart illustrating an algorithm for peak active energy detection of a previous speech segment in an AGC system, in accordance with an exemplary embodiment of the present invention.
Figure 8B:
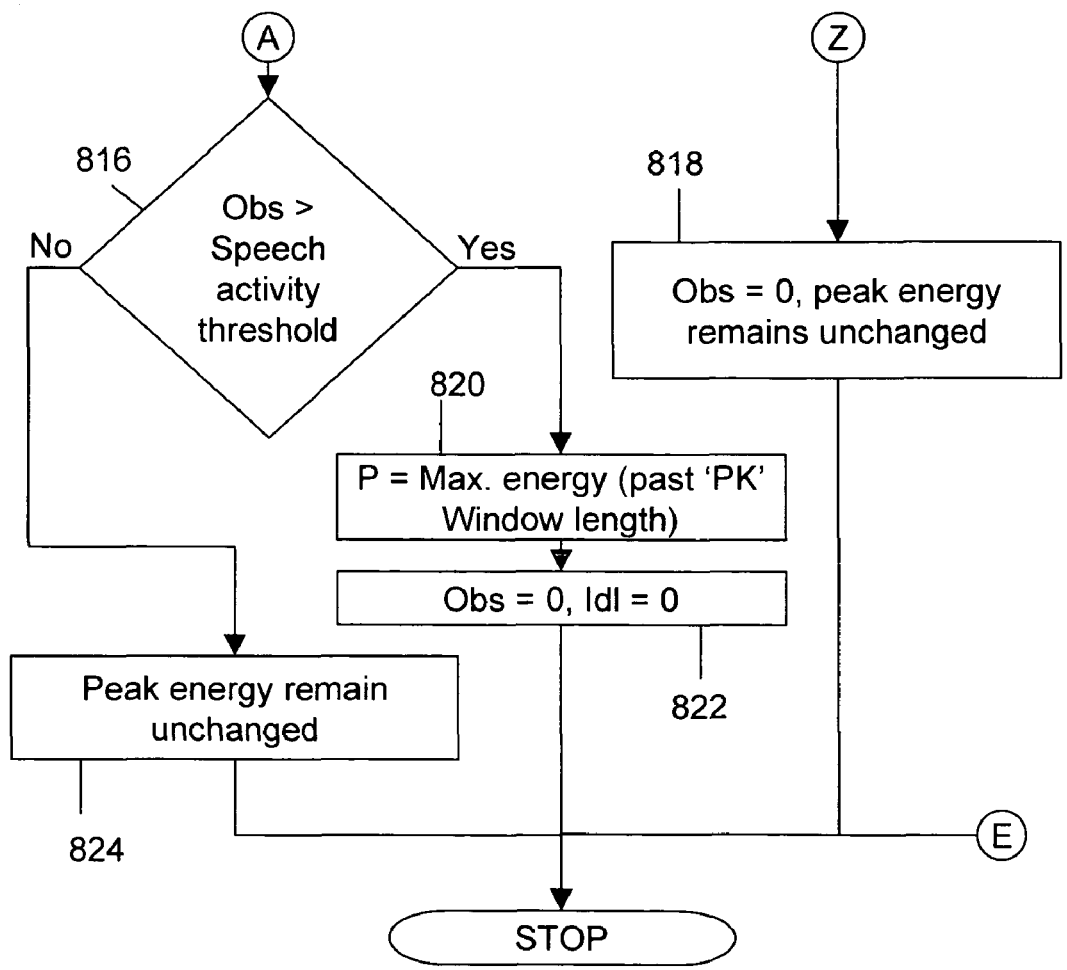

FIG. 8 is a flowchart illustrating an algorithm for peak active energy detection of a previous speech segment in AGC system 300, in accordance with an exemplary embodiment of the present invention. At step 802, the values of an observation counter (Obs) and an idle-time counter (Idl) are made zero. The observation counter can be used for tracking speech activities in the previous speech segment and the idle-time counter can be used for tracking speech inactivity in the previous speech segment. At step 804, it is determined whether the peak active energy, P, of the previous speech segment is greater than the average level of energy, E, at which communication system 100 should be operated. The peak active energy of the previous speech segment can be determined by one of the following methods:

a) By taking the average energy of the previous speech segment; or
b) By calculating the active peak energy of each sample within the previous speech segment and computing the background noise floor of each sample.

If the peak active energy of the previous speech segment is less than the average level of energy, step 806 is performed. At step 806, the peak active energy is changed in accordance with the following formula:

$$P=P+\text{Attack constant}*(E-P) \qquad (3)$$

where:
  'P' is peak active energy of the previous speech segment,
  'E' is average energy level at which communication system 100 should be operated, and
  'Attack constant' is a first constant in the peak active energy detection system and is defined as the rate at which the peak active energy should be increased. The value of attack constant is defined on the basis of the requirements of communication system 100. For experimental purposes, the value of attack constant is taken as 0.27. The formula mentioned above can be interpreted as the peak active energy that is updated up to 27 percent of the difference of the average energy and peak active energy of the previous speech segment.

If the peak active energy of the previous speech segment is greater than or equal to the average energy level, step 808 is performed. At step 808, it is determined whether the SID value of the previous speech segment is equal to 1. If the SID value of the previous speech segment is 1, step 810 is performed. At step 810, the idle-time counter is incremented by 1.

Whereas, at step 808, if the SID value of the previous speech segment is not equal to 1, step 812 is performed. At step 812, the observation counter is incremented by 1 and the idle-time counter is reset. Here, the peak active energy of the speech segment can be computed, using the following formula:

$$P = P - \text{Fading Slope} \quad (4)$$

where:

'fading slope' is a second constant in the peak active energy detection system and is defined as the value at which the peak active energy can be decreased. The typical value of the fading slope for experimental purposes can be taken as: 0.032 decibels (dB) per speech segment.

At step 814, it is determined whether the value of idle-time counter is greater than the value of speech inactivity threshold. The speech inactivity threshold can include nonactive previous speech segments, with each speech segment carrying 70 samples. If idle-time counter is greater than speech inactivity threshold, step 818 is performed. At step 818, observation counter is reset and peak active energy remains unchanged.

At step 814, if the idle counter is less than or equal to speech inactivity threshold, step 816 is performed. At step 816, it is determined whether the observation counter is greater than or less than speech activity threshold. If observation counter is greater than the speech activity threshold, as shown in step 820, peak active energy can be computed using the following formula:

$$P = \text{Maximum energy (past 'PK' window length)} \quad (5)$$

where:

'PK' window length can be, by way of example only a window length of 25 samples. Further, at step 822, the observation counter and the idle-time counter are both reset. At step 816, if the observation counter value is less than or equal to speech activity threshold, step 824 is performed. At step 824, the peak active energy remains unchanged. The value of peak active energy at this stage becomes the detected peak active energy for the previous speech segment.

Figure 9:
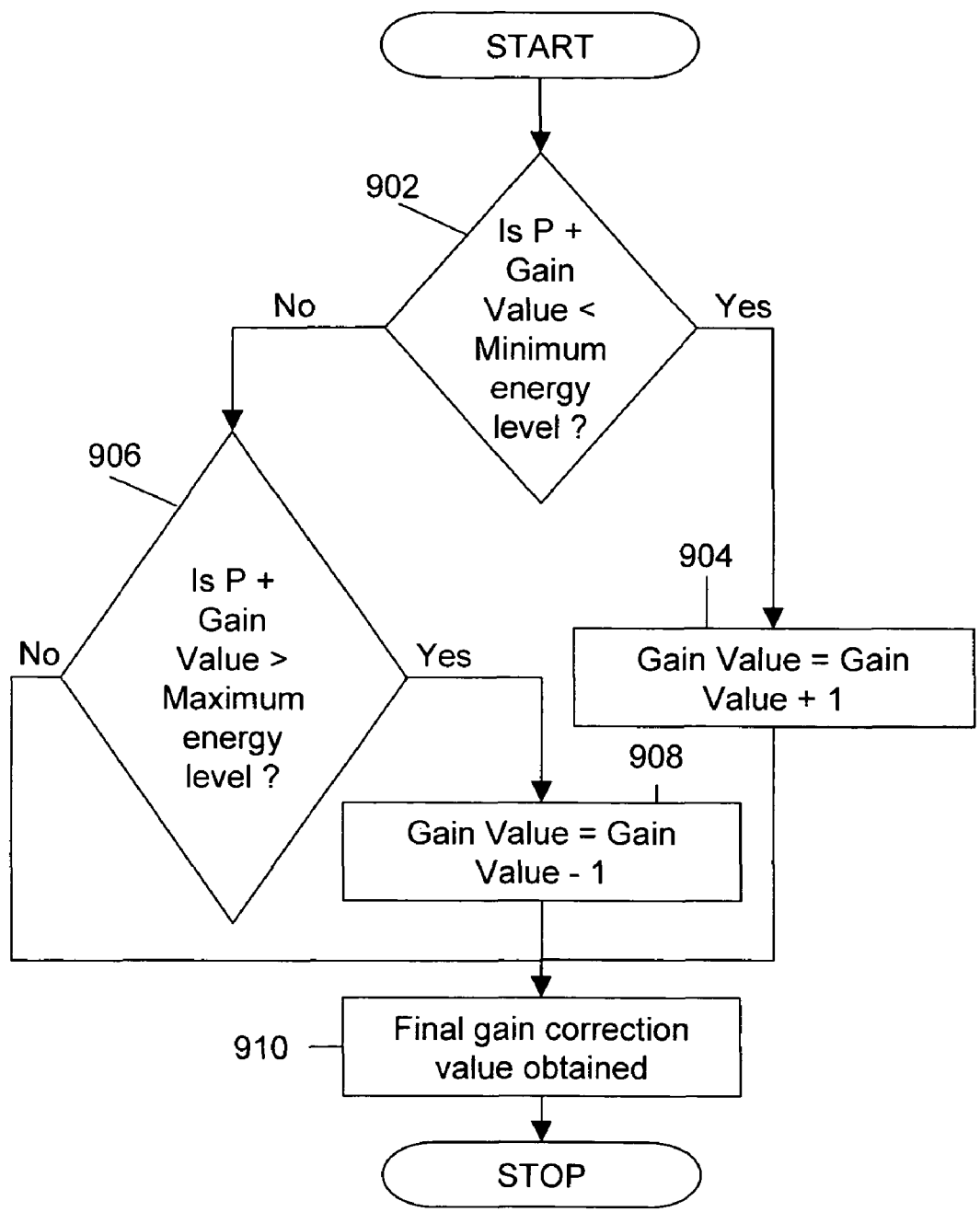
FIG. 9 is a flowchart illustrating an algorithm for gain value calculation in an AGC system, in accordance with an exemplary embodiment of the present invention.

FIG. 9 is a flowchart illustrating an algorithm for gain value calculation in AGC system 300, in accordance with an exemplary embodiment of the present invention. Gain value calculator 504 calculates the gain value. Gain value calculator 504 attempts to keep the sum of detected peak active energy of the previous speech segment and a gain value within pre-defined minimum and maximum energy levels. At step 902, gain value calculator 504 checks whether the sum of peak active energy and the gain value (in dB) is less than the pre-defined minimum energy level. If the sum of peak active energy and the gain value is less than the pre-defined minimum energy level, step 904 is performed. At step 904, the gain value is incremented by 1 dB or any other suitable incremental amount.

At step 902, if the sum of peak active energy and the gain value is greater than or equal to the pre-defined minimum energy level, step 906 is performed. Further, at step 906, gain value calculator 504 checks whether the sum of peak active energy and the gain value is greater than the pre-defined maximum energy level. At step 906, if it is determined that the sum of peak active energy and the gain value is greater than the pre-defined maximum energy level, step 908 is performed. At step 908, the gain value is decremented by 1 dB or any other suitable incremental amount. At step 906, if it is determined that the sum of peak active energy and the gain value is less than or equal to the pre-defined maximum energy level, the gain value remains unchanged.

At step 910, the final gain value becomes the gain correction value that is to be applied to the speech segment. Gain value calculator 504 forwards the gain value to gain block 304.

Figure 10A:
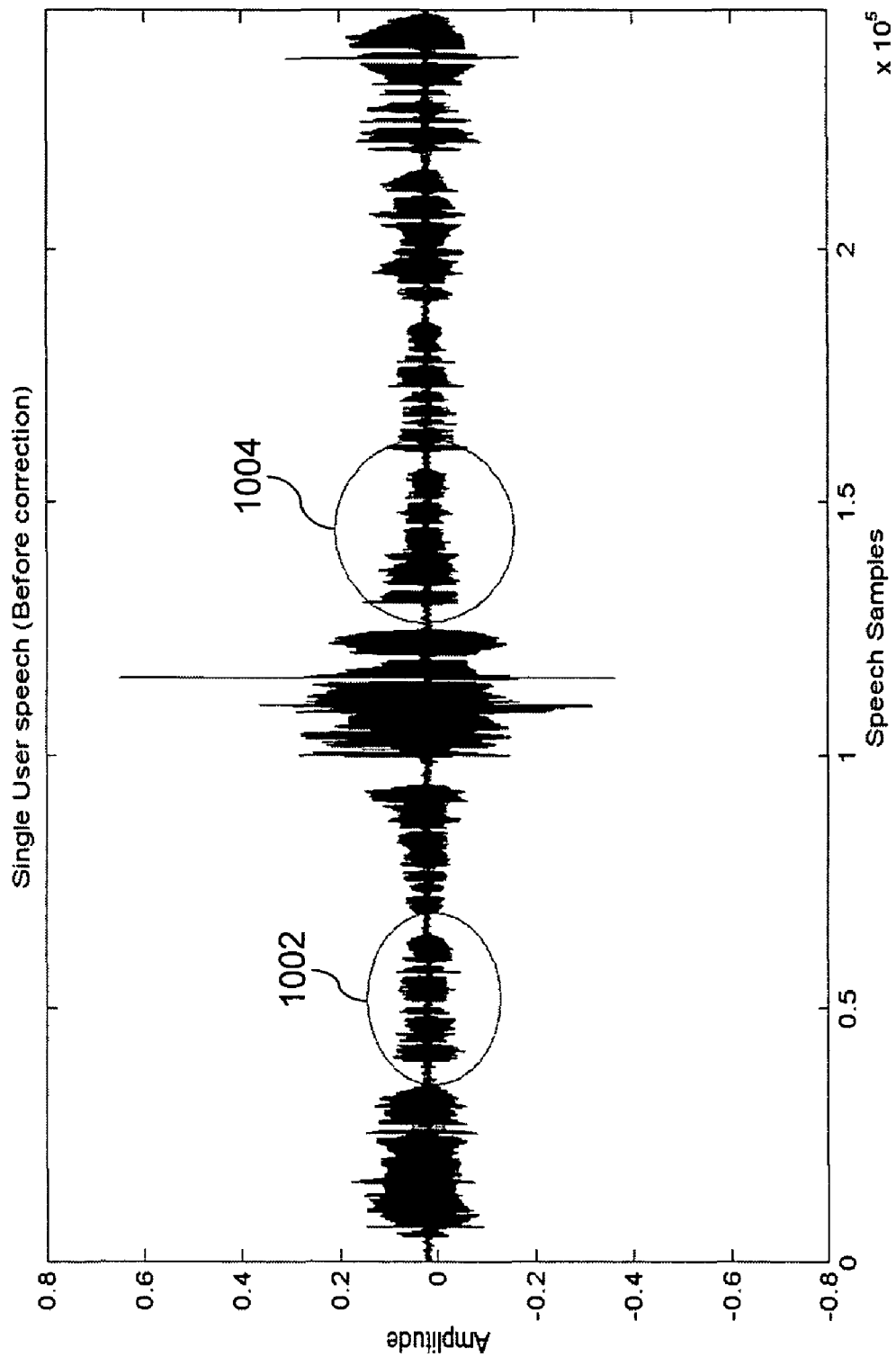
FIG. 10a is a waveform of speech samples before gain correction when a speaker speaks with speech samples of varying speech levels, in accordance with an exemplary embodiment of the present invention.

The method for gain correction can be applied to communication system 100 in one or more situations involving speech. FIG. 10a is a waveform of speech samples before gain correction is initiated when a speaker speaks with speech signals of varying speech levels, in accordance with an exemplary embodiment of the present invention. The soft speech levels may arise due to some distance between the position of the microphone and the speaker. It is expected that the gain controlled and encoded speech samples should be obtained as sustained speech samples at the decoder output. Points 1002 and 1004 in the waveform denote the soft speech samples of the speaker.

Figure 10B:
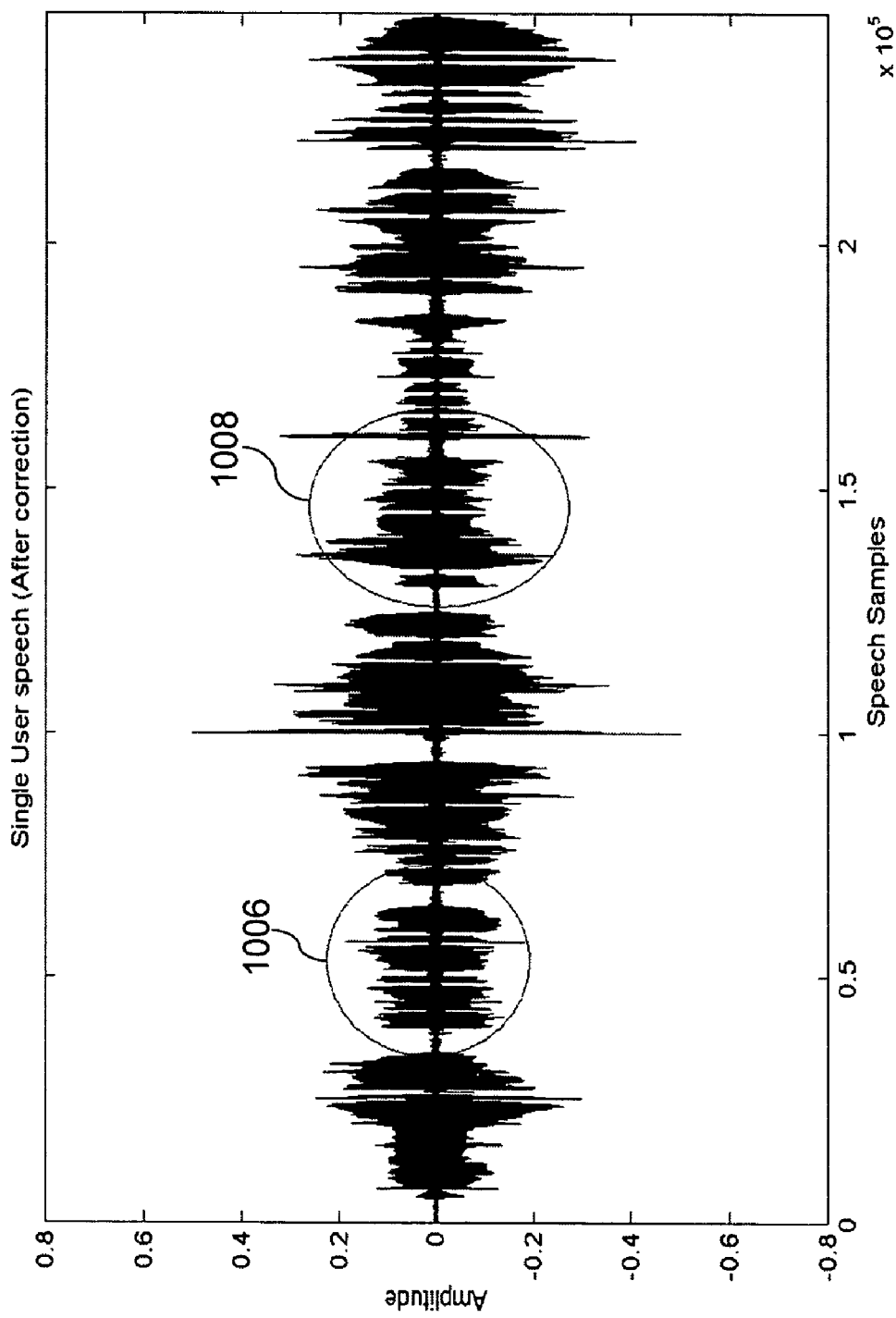
FIG. 10b is a waveform of speech samples after gain correction when a speaker speaks with speech samples of varying speech levels, in accordance with an exemplary embodiment of the present invention.

When the AGC is applied and the speech samples are encoded, the speech samples obtained at the decoder output are shown by the waveform in FIG. 10b. Points 1006 and 1008 in FIG. 10b are the gain corrected soft speech samples. AGC System 300 in the present embodiment works in two phases, namely an observation phase and a correction phase. In the observation phase, AGC system 300 observes the energy of the speech samples and calculates the gain value. As shown in FIG. 10a, point 1004 occurs immediately after the high energy speech samples. FIG. 10b shows that AGC system 300 did not over-boost the speech samples with high energy as the speech samples were in the observation phase for this time period. However, as soon as AGC system 300 detects the occurrence of soft speech samples at point 1004, it enters into a correction phase and applies gain correction to the soft speech samples. This is shown by points 1006 and 1008 in FIG. 10b.

Figure 11A:
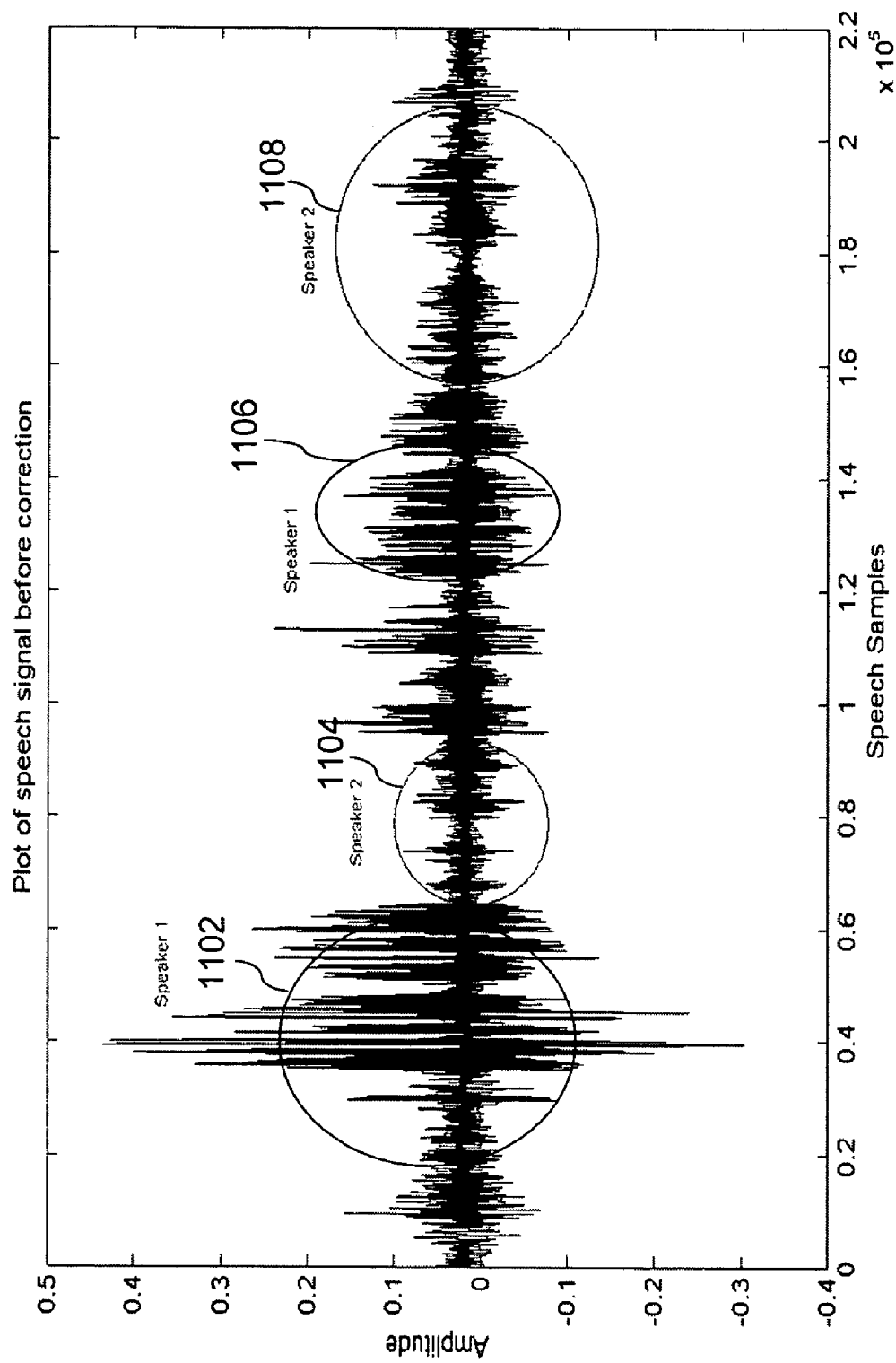
FIG. 11a is a waveform of speech samples before gain correction when two speakers are in conversation, in accordance with an exemplary embodiment of the present invention.
Figure 11B:
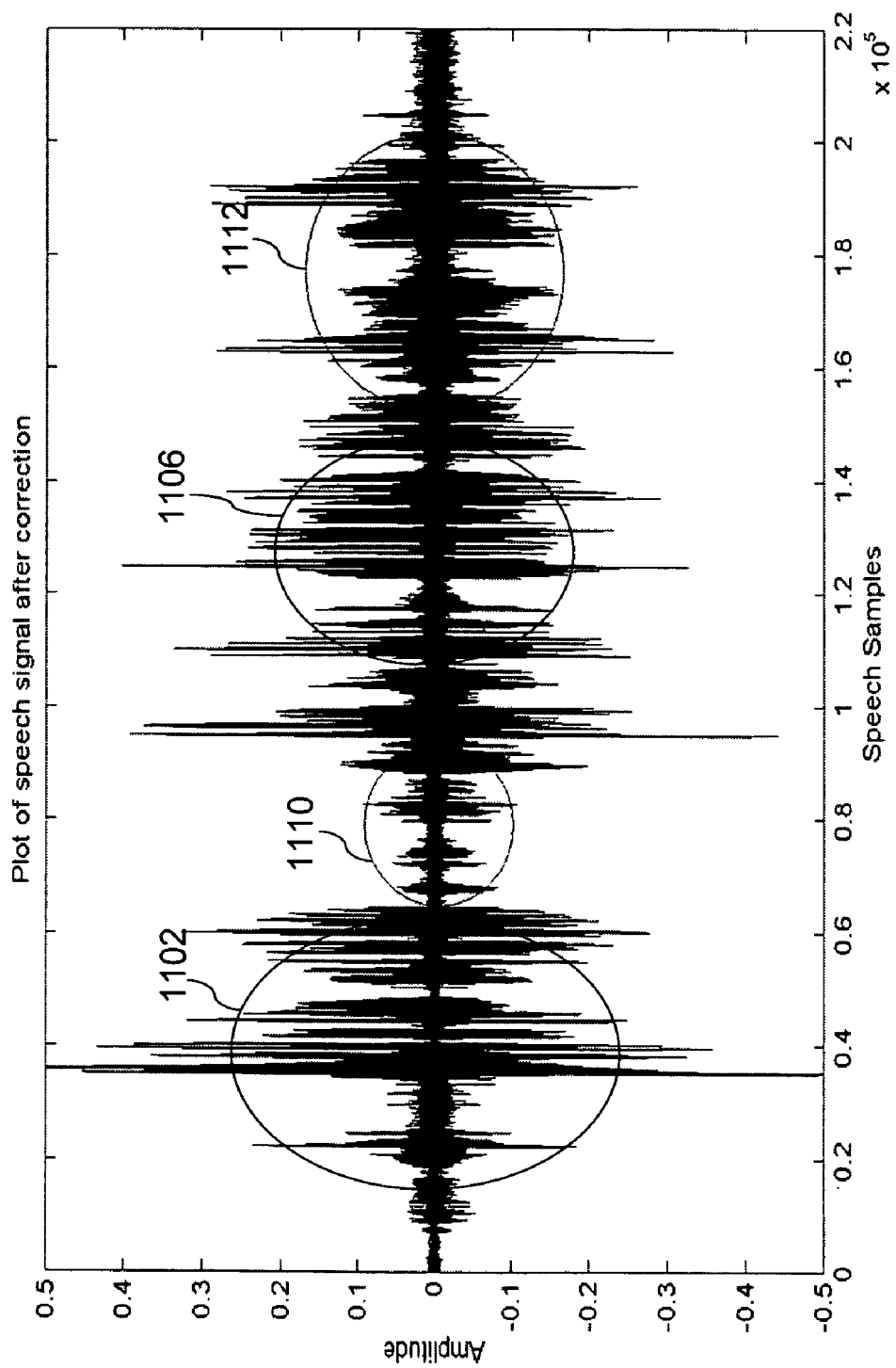
FIG. 11b is a waveform of speech samples after gain correction when two speakers are in conversation, in accordance with an exemplary embodiment of the present invention.

FIG. 11a and 11b shows a waveform of speech samples before gain correction when two speakers are in conversation, in accordance with an exemplary embodiment of the present invention. Both the speakers have varying speech levels. The present embodiment denotes soft speech samples in situations where the second speaker is intentionally speaking softly, and is at a substantial distance from the microphone while responding to the first speaker who is speaking at close proximity to the microphone. Points 1102 and 1106 in FIG. 11a denote appropriate speech samples from the first speaker, whereas points 1104 and 1108 in FIG. 11a denote soft speech samples from the second speaker. Point 1110 in FIG. 11b denotes that AGC system 300 is not fully trained, but by the time AGC system 300 encounters point 1112, it becomes fully trained and applies the gain correction on the soft speech samples.

FIG. 12 is a tabular representation showing a comparison of MIPS values between AGC system 200 used in prior art and AGC system 300 used in the present invention. As shown in FIG. 12 when AGC system 200 is independent of encoder 210, the MIPS values are 2.3145 whereas in situations where AGC system 300 is used in conjunction with encoder 310, the MIPS values are 0.1. The MIPS values are substantially reduced as the steps of filtering, computing energy and determining SID value that were being performed twice in the prior art, first time independent of encoder 210 and second time by encoder 210, are performed just once by encoder 310 in the present invention. The MIPS values for prior art are shown by row numbers 1202 to 1210 and the corresponding column number 1212 whereas the MIPS values for the present invention are shown by row numbers 1202 to 1210 and the corresponding column number 1214.

While the preferred embodiments of the present invention have been illustrated and described, it will be clear that the invention is not limited to these embodiments only. Numerous modifications, changes, variations, substitutions and equivalents will be apparent to those skilled in the art without departing from the spirit and scope of the invention, as described in the claims.

What is claimed is:

1. A system for automatic gain control of an incoming speech signal, the system comprising:
   a. a gain block, the gain block receiving the incoming speech signal in the form of one or more speech segments, the gain block also correcting the gain of a current incoming speech segment from the one or more speech segments;
   b. an encoder, the encoder encoding the gain corrected speech segment, wherein the encoder computes the signal energy and a silence indication value of the gain corrected speech segment; and
   c. a feedback gain block, the feedback gain block computing a gain value based on the energy and the silence indication value of a previous speech segment form the one or more speech segments, the computed gain value is provided as a feedback to the gain block.

2. The system according to claim 1, wherein the encoder comprises:
   a. a high pass filter, the high pass filter removing the low frequency components and the direct current (DC) offset from the current incoming speech segment;
   b. an energy calculator, the energy calculator determining the energy of the current incoming speech segment; and
   c. a silence indication estimator, the silence indication estimator detecting the speech activity and the silence activity in the current incoming speech segment, the speech activity and the silence activity are detected based on the output from the energy calculator.

3. The system according to claim 1, wherein the feedback gain block comprises:
   a. a peak detector, the peak detector detecting a peak active energy of the previous speech segment; and
   b. a gain value calculator, the gain value calculator calculating the gain of the previous speech segment, the gain being calculated based on the output from the peak detector.

4. The system according to claim 1, wherein the encoder is a code excited linear prediction (CELP) coder.

5. The system according to claim 4, wherein the CELP coder, can be an adaptive multi rate speech (AMR) coder.

6. A method for automatic gain control of an incoming speech signal in a communication device having an encoder, the method comprising the steps of:
   a. receiving the incoming speech signal, the incoming speech signal being received in the form of one or more speech segments;
   b. computing, by means of the encoder, an energy and a silence indication value of a previous speech segment from the one or more speech segments;
   c. correcting the gain of a current incoming speech segment based on the one or more speech segments, the gain being corrected based on the energy and the silence indication value computed by the encoder; and
   d. encoding the gain corrected speech segment, the gain corrected speech segment being encoded by the encoder.

7. The method of claim 6, further comprising the step of filtering the gain corrected speech segment prior to encoding, the gain corrected speech segment being filtered by the encoder.

8. The method according to claim 6, wherein the step of correcting the gain of the current incoming speech segment comprises the steps of:
   a. calculating the energy of the previous speech segment, the energy being calculated by the encoder;
   b. computing the silence indication value of the previous speech segment, the silence indication value being computed by the encoder based on the calculated energy;
   c. detecting a peak active energy of the previous speech segment based on the comparison between the actual peak active energy of the previous speech segment and a pre-defined average operating energy;
   d. calculating a gain value on the basis of a comparison between the detected peak active energy and pre-defined minimum and maximum energy levels; and
   e. applying the calculated gain value to the current incoming speech segment.

9. The method according to claim 8, wherein the silence indication value is 1 if the calculated energy of the previous speech segment determines speech inactivity (silence).

10. The method according to claim 8, wherein the silence indication value is 0 if the calculated energy of the previous speech segment determines speech activity.

11. The method according to claim 8, wherein detecting the peak active energy comprises the steps of:
    a. increasing the actual peak energy by applying a first constant, the actual peak energy being increased if it is lower than the average operating energy; and
    b. decreasing the actual peak energy by applying a second constant, the actual peak energy being decreased if it is higher than the average operating energy.

12. The method according to claim 8, wherein the step of calculating the gain value comprises the steps of:
    a. incrementing the gain value if the detected peak active energy is less than a minimum pre-defined level of peak energy;
    b. decrementing the gain value if the detected peak active energy is more than a maximum pre-defined level of peak energy; and
    c. maintaining the gain value if the detected peak active energy is between the minimum and maximum pre-defined levels of peak energy.

13. A method for automatic gain control of an incoming speech signal, the method comprising the steps of:
    a. receiving the incoming speech signal, the incoming speech signal being received in the form of one or more speech segments;
    b. calculating the energy and a silence indication value of a previous speech segment from the one or more speech segments, the energy and the silence indication value being calculated by an encoder;
    c. calculating a gain value based on the energy and the silence indication value of the previous speech segment;
    d. correcting the gain of a current incoming speech segment from the one or more speech segments, the gain being corrected based on the calculated gain value; and
    e. encoding the gain corrected speech segment, wherein the gain corrected speech segment is filtered prior to encoding, the gain corrected speech segment being filtered and encoded by the encoder.

* * * * *